United States Patent
Josefiak et al.

(10) Patent No.: US 8,807,364 B2
(45) Date of Patent: Aug. 19, 2014

(54) RECEPTACLE DEVICE FOR A MODULAR TELEMATIC UNIT

(75) Inventors: Frank Josefiak, Bonn (DE); Hassan Aftabruyan, Köln (DE); Stefan Heimerl, Landshut (DE); Julian Baugatz, Berlin (DE); Andreas Wiechmann, Adendorf (DE)

(73) Assignee: Deutsche Post AG, Bonn (DE)

( * ) Notice: Subject to any disclaimer, the term of this patent is extended or adjusted under 35 U.S.C. 154(b) by 276 days.

(21) Appl. No.: 13/389,424

(22) PCT Filed: Jul. 8, 2010

(86) PCT No.: PCT/EP2010/059797
§ 371 (c)(1),
(2), (4) Date: Feb. 7, 2012

(87) PCT Pub. No.: WO2011/018282
PCT Pub. Date: Feb. 17, 2011

(65) Prior Publication Data
US 2012/0134129 A1 May 31, 2012

(30) Foreign Application Priority Data
Aug. 14, 2009 (DE) .......................... 10 2009 037 295

(51) Int. Cl.
*B65D 6/28* (2006.01)
(52) U.S. Cl.
USPC ........ 220/4.02; 220/23.89; 220/483; 220/1.5; 361/728; 361/730; 174/58; 174/50; 136/206; 136/251; 136/259
(58) Field of Classification Search
USPC ............... 361/728, 730; 174/58, 50; 136/206, 136/251, 259
See application file for complete search history.

(56) References Cited

U.S. PATENT DOCUMENTS

| 7,182,383 | B2 | 2/2007 | Anderson et al. |
| 7,600,907 | B2 * | 10/2009 | Liu et al. ...................... 362/555 |
| 2007/0272044 | A1 | 11/2007 | Huang |
| 2008/0061963 | A1 * | 3/2008 | Schnitz et al. ........... 340/539.13 |
| 2010/0018571 | A1 * | 1/2010 | Placer ........................... 136/251 |

FOREIGN PATENT DOCUMENTS

GB 2359208 A 8/2001

OTHER PUBLICATIONS

International Preliminary Report on Patentability, dated Aug. 14, 2009, (German).
International Search Report, dated Aug. 14, 2009, (German)-English translation.
Wechselaufbau, aus Wikipedia, der Freien Enzyklopädie, Jun. 16, 2009, translation: Swap body, pp. 1-31.
International Preliminary Report on Patentability, dated Aug. 14, 2009, English Translation.

* cited by examiner

*Primary Examiner* — David M Sinclair
*Assistant Examiner* — Robert Brown
(74) *Attorney, Agent, or Firm* — International IP Law Group, PLLC

(57) ABSTRACT

There is provided a receptacle for a modular telematic unit. An exemplary receptacle comprises a body, at least one housing, and at least one solar panel. The body comprises at least two rails positioned opposite from each other. The housing is configured to be detachably slid into the rails. The solar panel is configured to be detachably slid into the rails. An outer surface of the solar panel, when slid into the rails, is slanted at an angle α relative to at least one outer surface of the body. The outer surface of the body is positioned opposite the solar panel.

14 Claims, 7 Drawing Sheets

US 8,807,364 B2

RECEPTACLE DEVICE FOR A MODULAR TELEMATIC UNIT

CROSS-REFERENCE TO RELATED APPLICATIONS

Pursuant to 35 U.S.C. §371, this application is the United States National Stage Application of International Patent Application No. PCT/EP2010/059797, filed on Jul. 8, 2010, the contents of which are incorporated by reference as if set forth in their entirety herein, which claims priority to German (DE) Patent Application No. 10 2009 037 295.4, filed Aug. 14, 2009, the contents of which are incorporated by reference as if set forth in their entirety herein.

BACKGROUND

Typically, transportation containers, such as freight containers or swap bodies, include telematic units. These telematic units normally track at least the position of a transportation container and continuously transmit this information to a central data processing system. The data can be transmitted, for example, by a GPS module that is integrated into the telematic unit. Moreover, the condition of contents of the transportation containers can be ascertained by sensors and this status data can likewise be continuously transmitted to the central data processing system. Without continuous data transmission, a memory unit can be provided to store relevant data and this data can be read out of this memory unit at a later point in time. However, the functions here should only be regarded as examples and can be replaced or augmented by any other functions and modes of operation used for a given area of application of a telematic unit.

The telematic units can be detachably affixed to the transportation containers by receptacle devices. Such receptacle devices are known, for example, from U.S. Patent Application Publication No. 2007/0272044. This patent application discloses a remote controller and a fixture detachably mounted on the remote controller. The fixture is fully hidden behind the remote controller, thereby enhancing the aesthetic quality of the remote controller. The remote controller can be easily slid into a mounting seat of the fixture. The remote controller can be latched into a fastening hook of the fixture by an axial movement, so that the remote controller can be attached to the fixture easily and rapidly.

To fulfill its various functions, however, the telematic unit uses a power source. Various solutions for supplying a telematic unit with power, either continuously or temporarily, include, for example, a battery, an accumulator, a solar panel or wind power. For example, a known device is attached to the outer surface of a transportation container. In order to allow tracking of the transportation container, the device has a solar panel, a battery, a GPS module, a mobile radio-data-transceiver module and a microcontroller for controlling the GPS module and the mobile radio-data-transceiver module. The position of the transportation container can be detected periodically and transmitted to a tracking database of a central tracking computer. The solar panel, the battery, the GPS module, the mobile radio-data-transceiver module and the microcontroller are integrated into a one-piece, water-tight master control unit. The master control unit can also comprise a local wireless radio-data-transceiver module which allows the communication with radio sensors inside the transportation container through the walls of the transportation container.

Therefore, such telematic units can comprise various electronic components that, depending on the area of application, are appropriately combined and usually enclosed in a housing. The individual components of the telematic unit can also be attached individually to a transportation container or integrated in it. If the entire telematic unit or parts of it are attached to the outside of a transportation container, they are designed so as to be weather-proof. If a solar panel, for example, is used to supply the power, it has to be attached to the outside of the transportation container in such a way that it is exposed to sunlight for certain periods of time, but so that it is not damaged during the use of the transportation container. However, the solar module known from U.S. Patent Application Publication No. 2008/0611963, depending on the place of use and on the local weather conditions, is not capable of ensuring an efficient energy supply over a prolonged period of time, since the surface gets dirty over the course of time due to exposure to weather, which reduces the efficiency of the solar panel.

SUMMARY

The subject innovation relates to a receptacle device for a modular telematic unit. Normally, the electronic components of a telematic unit, including a solar panel, are combined, connected to each other, and attached to the particular transportation container making use of the telematic unit. However, an exemplary embodiment provides a telematic unit for various containers and applications. Such an embodiment also uses an efficient energy supply over a prolonged period of time.

An exemplary embodiment of the receptacle device for a modular telematic unit has a body comprising at least two rails situated opposite from each other, between which at least one housing and one solar panel are detachably slid in. Various components of the modular telematic unit can be accommodated in the housing.

The housing consists of several parts, whereby said housing is divided into at least two housing halves by a flat, lengthwise cut. In one embodiment, the housing is made of fiberglass-reinforced plastic which is suitable for applications under various climate conditions. Moreover, this material may be used to make different receptacles in the housing, whereby, for example, the outer surface of the solar panel is slanted at an angle $\alpha$ relative to at least one outer, opposite surface of the body. This reference surface of the body is, for example, the outer surface of the baseplate of the receptacle device. The angle $\alpha$ is between 1° and 5°, as a result of which dirt is less likely to accumulate on the slanted solar panel or at least such dirt is rinsed off again by rainwater and wind.

The slanted position of the solar panel can be attained in various ways. For example, it is possible for the rails to be slanted at an angle $\alpha$ relative to the at least one outer, opposite surface of the body. However, the rails can also be parallel to the at least one outer, opposite surface of the body, while the solar panel is shaped so as to be tapered in one direction, as a result of which the outer surface of the solar panel is slanted at an angle $\alpha$ relative to the at least one outer, opposite surface of the body.

In another embodiment, the rails are parallel to the at least one outer, opposite surface of the body, but the distance from the rails to the at least one outer, opposite surface of the body differs, as a result of which the outer surface of the solar panel, in turn, is slanted at an angle $\alpha$ relative to the at least one outer, opposite surface of the body.

In an exemplary embodiment, the body has a baseplate onto whose sides the rails are attached, whereby there is an air space between the baseplate of the body and the baseplate of the housing that has been slid into the rails. The air space allows ventilation of the housing and of the electronic components located in it. The height h of the air space is between 0.5 mm and 8 mm.

In an exemplary embodiment, the housing is attached to the body by at least two screwed connections, whereby a first screwed connection is a fixed bearing while a second screwed connection is a floating bearing with a longitudinal slot. As a result, it is possible to compensate for the different expansion rates of various materials used for the housing and for the body of the receptacle device, in spite of a tight connection.

In an exemplary embodiment, the body has at least one magnet with which the receptacle device can be attached to metal objects such as, for example, a freight container.

The subject innovation also encompasses a transportation container onto which a receptacle device is attached. This transportation container can be, for example, a freight container or a swap body, whereby the transportation container has channel-shaped depressions (roof molding) on the outside and the receptacle device is inserted into a channel-shaped depression. However, it can also be mounted without the presence of roof molding.

Advantageously, the receptacle device for a modular telematic unit includes an autonomous power supply, e.g., an integrated solar panel. The receptacle device as well as the housing that is slid into it are configured in such a way that any module-like units such as additional solar panels, accumulators, sensor units, radio modules, etc. can be added and thus combined. The receptacle device is easy to install and remove, whereby, in view of its geometry, it is especially well-suited for mounting in roof moldings of containers. The entire device is very sturdy, which is advantageous when it is used for freight containers and swap bodies.

BRIEF DESCRIPTION OF THE DRAWINGS

Additional advantages, special features and practical refinements of the invention ensue from the subordinate claims and from the presentation below of preferred embodiments making reference to the figures, in which:

DETAILED DESCRIPTION

Figure 1:
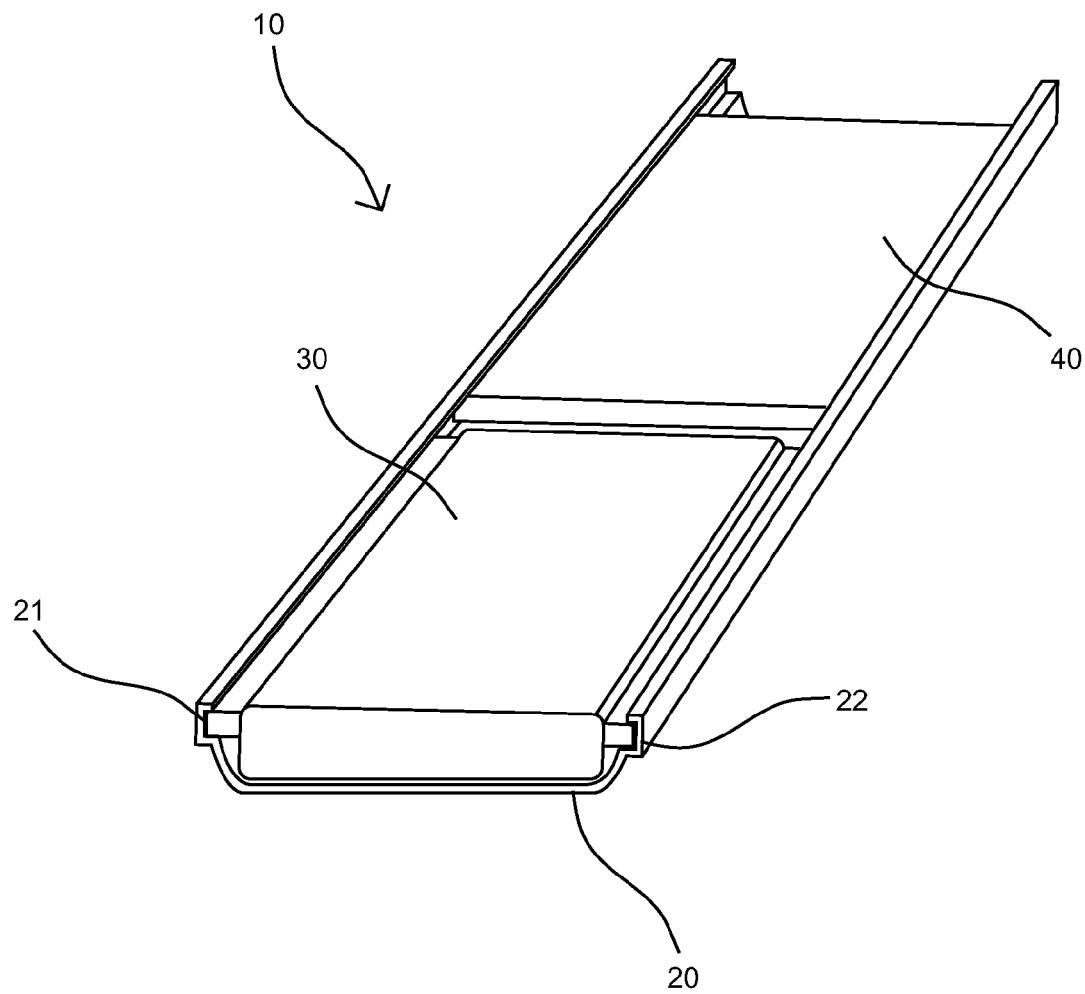
FIG. 1 is a front perspective view of an embodiment of the receptacle device according to an embodiment of a modular telematic unit.

FIG. 1 is a front perspective view of an embodiment of the receptacle device 10 for a modular telematic unit. The receptacle device 10 comprises a rectangular baseplate (not shown in FIG. 1) and two lateral rails 21 and 22. Various components of a modular telematic unit can be slid between these rails 21 and 22 and thus be combined with each other, depending on the application. The individual components can operate independently of each other or else they can be connected to each other.

According to the subject innovation, at least one solar panel 40 and one housing 30 are slid in between the rails 21 and 22. These components can be slid in from one short end as well as from both short ends of the receptacle device. If the components are only slid in from one short end, a stop can be provided at the opposite end against which all of the components can be slid. This embodiment with a stop has the advantage that only the last component that is slid in has to be attached to the body 20. If there is no stop, then all of the components may be attached to the body, which can be done, for example, by screwed connections and/or pin joints. As an alternative or in addition to this, the components can also be snapped between the rails if the dimensions are suitably selected.

In an exemplary embodiment, the receptacle device 10 is configured to be flat and elongated so that several likewise flat components can be slid one after the other between the rails 21 and 22. In one embodiment, the length of the receptacle device is 20 cm while the width is 11 cm. A width of 11 cm allows the receptacle device 10 to be inserted, together with telematic components, into channel-shaped depressions (roof molding) on the outside of freight containers or swap bodies, said depressions being formed by the reinforcement of the metal side walls of such transportation containers. These channel-shaped depressions have a standard width of approximately 12 cm and a depth of approximately 2 cm.

Moreover, the height of the receptacle device 10 results, for example, from the depth of the channel-shaped depressions in the side walls of the transportation containers, since the receptacle device is configured to be relatively flat so that it can be installed virtually flush into a channel-shaped depression. Consequently, the receptacle device extends only slightly or not at all beyond the edges of the depressions, as a result of which, it is exposed to very little mechanical stress. This lowers the risk of damage to the receptacle device. In this context, a height of 3 cm has proven to be advantageous.

In contrast, the length of the receptacle device can be selected at will. In particular, several of the receptacle devices can be installed one after the other in a channel-shaped depression and they can also be coupled to each other.

The rails 21 and 22 can be formed, for example, by two grooves in the side walls of the body 20. Here, it is possible for these grooves not to run in parallel but rather at an angle relative to each other. Consequently, the distance between the grooves would be greater on one short end of the receptacle device than on the other short end. In such a case, telematic components may be slid into the rails from the end with the larger groove distance and, starting at a specific point, they would be pressed between the grooves in the case of converging grooves, which results in a fixation of the components within the rails. The geometry of the telematic components could likewise be selected in such a way that this effect is enhanced.

According to the subject innovation, at least one solar panel 40 is slid between the rails 21 and 22. The solar panel is configured to be flat and protrudes only slightly or not at all beyond the upper edges of the rails. For this purpose, each of the side surfaces of the solar panel 40 can be installed in the grooves of the rails, or else the solar panel has tongues on the side that engage in the grooves of the rails.

Figure 2:
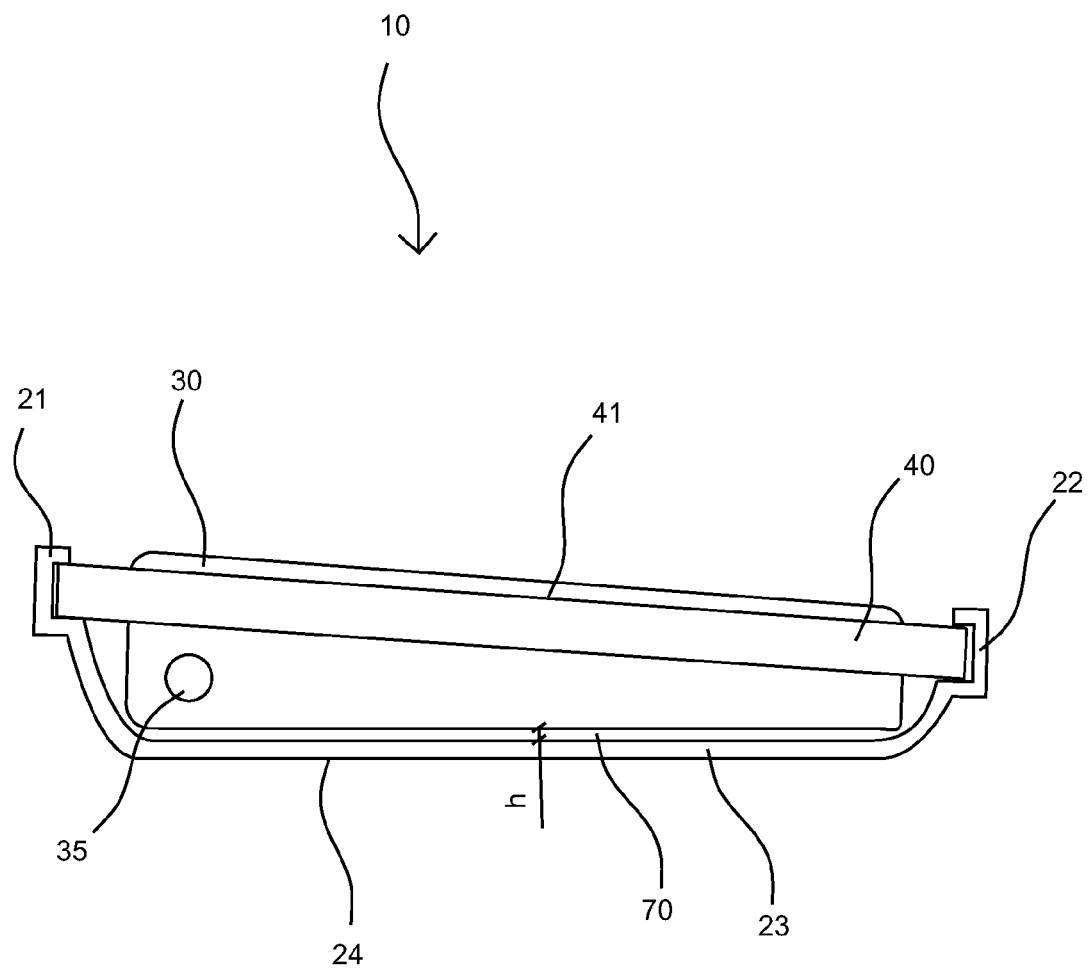
FIG. 2 is a rear view of an embodiment of a receptacle device according to an embodiment for a modular telematic unit.

FIG. 2 is a rear view of an embodiment of a receptacle device for a modular telematic unit. The solar panel 40 is now shown in front of the housing 30, which is behind the former. Each side surface of the solar panel 40 is installed in the grooves of the rails 21 and 22. Here, it is provided that the outer surface 41 of the solar panel 40 is slanted and is thus at an angle α relative to the outer surface 24 of the body 20 of the receptacle device 10. This is achieved, for example, in that the two rails 21 and 22 are arranged at different heights relative to the baseplate 23. Consequently, the solar panel 40 is slanted relative to the baseplate 23 of the body 20, whereby an angle α between 1° and 5° has proven to be advantageous.

Therefore, when the body 20 is mounted on a transportation container in such a way that the baseplate 23 rests on the transportation container, the solar panel 40 is also slanted relative to the appertaining outer surface of the transportation container. In an exemplary embodiment, the receptacle device is mounted onto a transportation container such as a freight container or swap body in such a way that the slanted position of the solar panel 40 is oriented opposite to the transportation or driving direction of the container. This has the advantageous effect that dirt on the solar panel is removed by rainwater and/or wind while the transportation container is moving. Even when the transportation container is standing still, the surface of a solar panel can be rinsed off by rainwater that runs off to one side of the solar panel. In an exemplary embodiment, no dirt accumulates on the solar panel but rather it flows off or falls off to one side of the solar panel.

Thus, in the embodiment of the subject innovation shown in FIG. 2, the solar panel is in a slanted position, which is achieved by rails of different heights. However, it can also be provided that the grooves of the rails are arranged at the same height but that the solar panel itself is configured to be concave, so that it is tapered toward one side. This, too, could result in a slanted position of the outer surface 41 of the solar panel 40 relative to the baseplate 23 of the body 20. It is also possible to insert the solar panel into the receptacle device 10 in a straight position but to thus mount the entire receptacle device on a transportation container in a slanted position.

Thus, in the embodiment of the subject innovation shown in FIG. 2, the solar panel 40 is in a slanted position, crosswise to the longitudinal axis of the receptacle device. This means that the receptacle device is mounted crosswise to the transportation or driving direction of a container in order to achieve the advantageous cleaning effect. This is often the case since channel-shaped depressions in the top of a freight container or swap body normally likewise run crosswise to the transportation or driving direction of a container in order to increase the stiffness of the roof construction in the driving direction. However, if a receptacle device is to be mounted along the transportation or driving direction of a container, then the slanted position of the solar panel 40 can also be achieved by rails that are at the same height but not parallel to the baseplate of the body. In this case, the rails 21 and 22 are slanted at an angle α relative to the outer surface 24 of the baseplate. As an alternative, the slanted position of the solar panel can be achieved here as well by a concavely configured solar panel that is slid into parallel rails situated at the same height. Here, the slant of the solar panel would be in the direction of the longitudinal axis of the receptacle device.

FIG. 2 also shows that the housing 30 is mounted at a distance h from the baseplate 23 of the receptacle device. Thus, an air space 70 is formed that serves to ventilate the housing 30 or the electronic components located therein. In the middle of the receptacle device, this distance h is at least 0.5 mm.

In an exemplary embodiment, the housing 30 is made up of several parts and consists of at least two housing halves that are formed by a flat, lengthwise cut through the housing. Once the housing halves are joined, the result is a flat housing that can be slid via its side walls into the rails 21 and 22 of the receptacle device. For this purpose, tongues that engage in the grooves of the rails can be affixed to the sides of the housing 30. As an alternative, the housing can be inserted into the rails via its side surfaces.

In this context, a flat, lengthwise cut means that the rectangular housing 30 is split along its longitudinal axis and through the low side walls, resulting in a lower and an upper housing half whose cut openings each free the interior of the appertaining housing half. Both housing halves may be made of fiberglass-reinforced plastic, so that any desired outer geometries and internal shapes can be easily created. In an embodiment, the material of the housing is light-colored and reflecting particles can be incorporated into the material of the housing in order to prevent the housing from heating up excessively due to sunlight exposure. The housing accommodates the components of a modular telematic unit so that, the receptacles formed within the housing are of various shapes and sizes.

Figure 3:
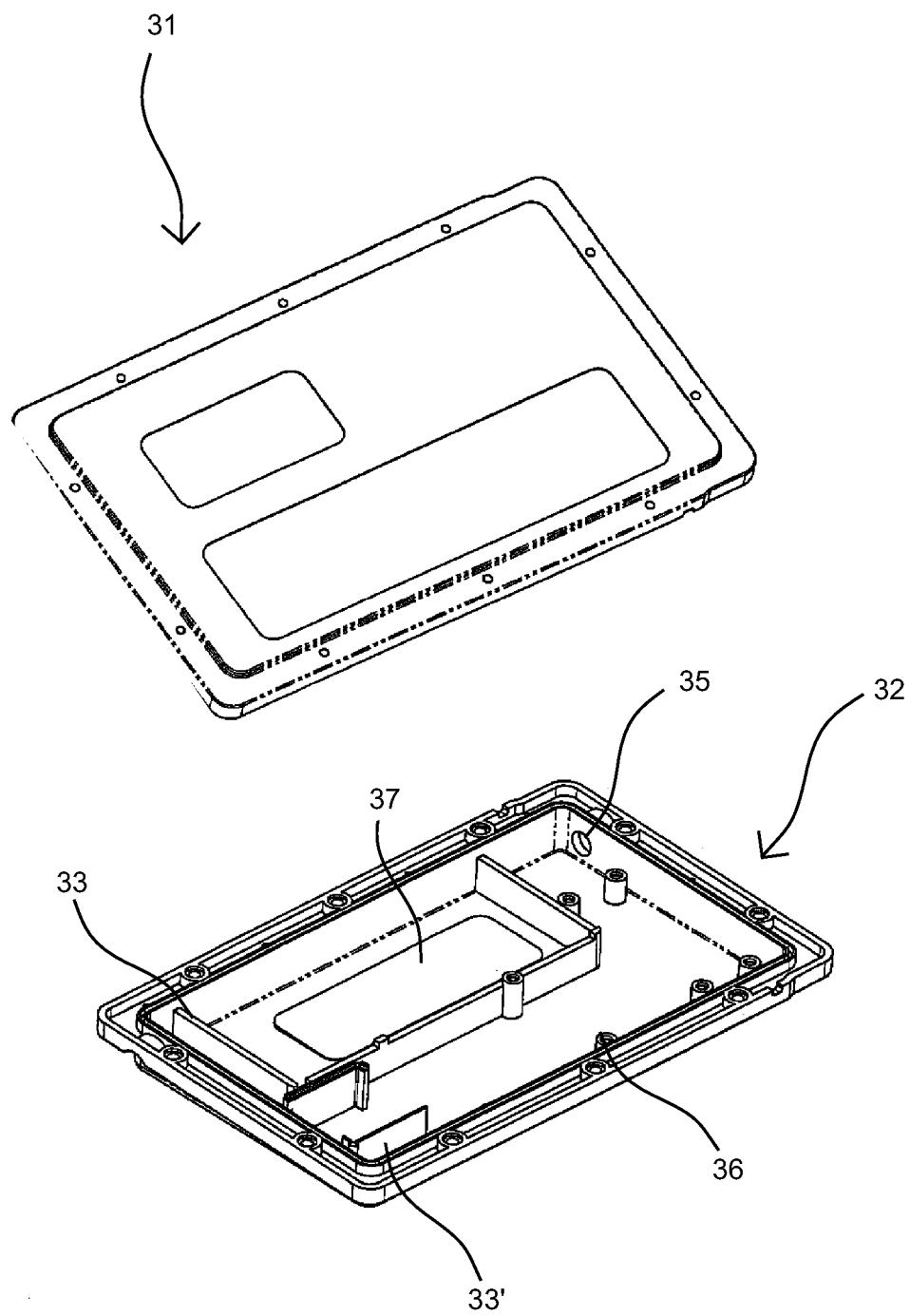
FIG. 3 is a top perspective view of a housing half according to FIG. 2, with installed telematic components.

An embodiment of a lower housing half 32 is shown in FIG. 3, which is a top perspective view of the housing half according to FIG. 2, with installed telematic components. In an exemplary embodiment, this lower housing half 32 has at least two receptacles 33 and 33' into which components of a modular telematic unit can be inserted. A receptacle is formed, for example, by at least two side walls between which a component can be inserted. Moreover, holes can be drilled in order to affix the inserted components directly by a screw or, for example, in order to affix a cover plate. In order to be able to connect the components inside the housing 30 to other components in the rail 10, at least one opening 35 is provided through which cables can be fed. However, the possibility also exists to already provide connections in the edge area of the housing so that these connections are integrated into the housing and can be contacted from both sides. Then, the components of the housing would be connected from the inside, whereas, for example, the solar panel 40 would be connected to the housing from the outside, in order to directly supply the components of the modular telematic unit with power or to charge an accumulator.

In the embodiment shown in FIG. 3, side walls are provided in a first receptacle 33 in order to position an accumulator, whereas a smaller area 33' comprises two side walls to accommodate a GPS module. In an exemplary embodiment, the lower housing half 32 has a depression 37 on the outside in the area of the receptacle 33 for the accumulator, and this depression 37 is in the form of an elevation inside the housing. This depression 37 can be used to position the accumulator, to cool the air gap or to install a cushion made, for instance, of foam.

Figure 4:
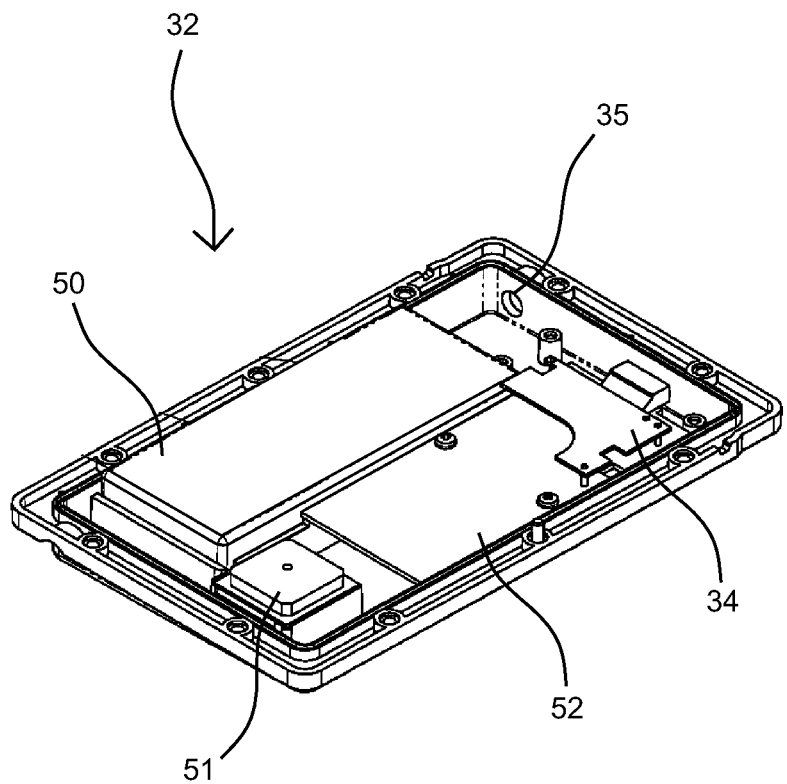
FIG. 4 is a top perspective view of a housing half according to FIG. 2, with installed telematic components.

FIG. 4 is a top perspective view of a housing half according to FIG. 2, with installed telematic components. FIG. 4 shows how these components of a modular telematic unit are inserted into the receptacles 33 and 33'. The accumulator 50 has been placed into the receptacle 33, while the GPS module 51 has been placed into the receptacle 33'. Furthermore, it can be seen that a printed circuit board or mainboard 52 has been installed in addition to the accumulator 50 and the GPS module 51. The printed circuit board is partially covered by a cover plate 34. There is enough space between the various receptacles to be able to connect the individual components to each other via cables. If applicable, cable bushings or prefabricated connections can be provided for this purpose.

The components shown in FIG. 4 by way of an example are not be construed in any restrictive sense but rather, the housing can be fitted with any other components of a modular telematic unit. For example, radio modules, GSM modules or sensors such as temperature sensors can be installed.

Furthermore, in an exemplary embodiment, the lower housing half 32 has bores 36 for purposes of mounting the upper housing half 31. Here, the two housing halves 31 and 32 can be screwed together, or else pins of one housing half engage into a correspondingly shaped bore in the other housing half. As an alternative or in addition to this, however, the two housing halves may be connected using, for instance, hooks, clips, rubber bands, etc.

FIG. 3 also shows the upper housing half 31 whose outer surface has additional depressions that are in the form of elevations inside the housing. Furthermore, however, the parts of the housing 30 are situated in the lower housing half 32 that is fitted with components of the modular telematic unit. Thus, the upper housing half serves as a cover of the housing 30. However, it can also be provided with webs or elevations that, during the assembly of the cover, are in contact with the telematic components, which accounts for an additional stabilization or fixation of that particular component.

Figure 5:
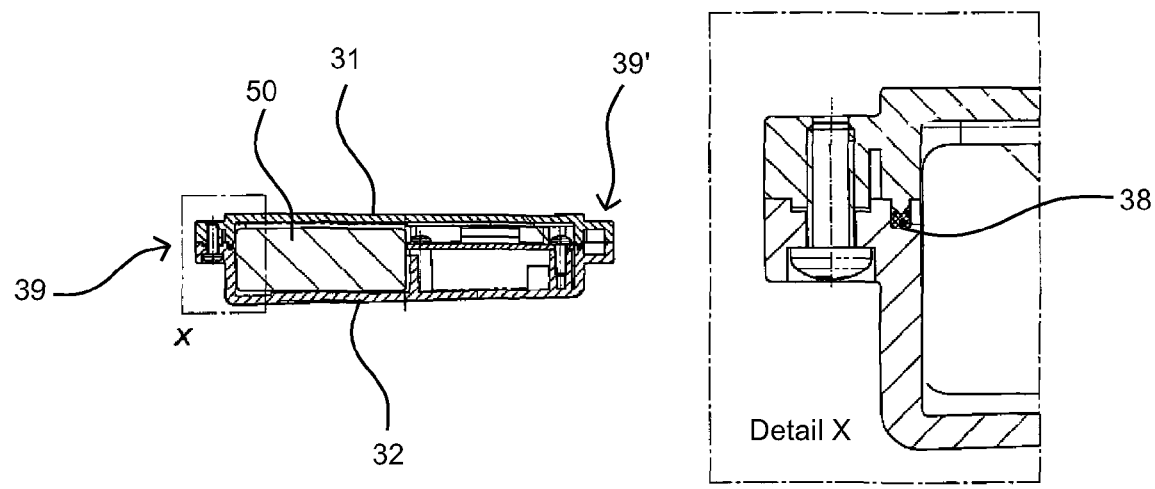
FIG. 5 is a side view of the two housing halves assembled to form a housing.

FIG. 5 is a side view of the two housing halves assembled to form a housing. FIG. 5 shows a cut through both housing halves 31 and 32 after the assembly. The cut runs crosswise through the middle of the housing 30. An enlarged section of this assembly shows that the two housing halves are joined with a gasket 38 in order to make the housing weather-proof, particularly so that the components on the inside cannot be damaged by penetrating water. Due to circumferential edge elevations on both housing halves, a thickened segment 39 and 39' is formed during the assembly on two opposing sides and these thickened segments 39 and 39' can engage as a tongue in the groove of a corresponding rail. As an alternative, however, a tongue can be shaped only onto the outside of a housing half, whereby for example, the lower housing half can be provided for this purpose since, in the described embodiment, it offers larger side surfaces for the installation of a tongue.

In another embodiment, two lateral tongues can be provided on the housing 30 that are made of a material other than fiberglass-reinforced plastic in order to prevent abrasion of housing material when the housing is repeatedly installed and removed. Materials such as metals or ceramics can be used for this purpose.

It is also possible to configure the rails 21 and 22 as tongues, while corresponding grooves are located in the housing 30 as well as in the solar panel 40 into which the components can be inserted via the tongues. In any case, a tongue does not extend beyond the total length of a component or of the receptacle device 10, but rather, such tongues can also be individual block-shaped elements that are inserted into the corresponding grooves.

The solar panel 40 and the housing 30 can be attached to the body 20 of the receptacle device in various ways. This may be done by a detachable screwed connection. With a fiberglass-reinforced plastic selected as the material for the housing, whereas the base is made of a metal such as, for instance, an Al—Mn alloy, thermal expansion of the individual components can occur when the receptacle device heats up, for example, on the top of a container that is exposed to sunlight. However, the different thermal expansion rates of the materials used can give rise to strains between the components when they expand to differing extents.

An exemplary embodiment uses a flexible connection of the components to the body of the receptacle device. Since such a flexible connection might not provide an adequate attachment, it has proven advantageous to use a combination of a fixed connection and a floating bearing. For example, one side of the housing 30 is tightly screwed to the body by a screw and a corresponding bore. In contrast, a second screw engages into a longitudinal slot and the screw is only tightened to such an extent that it can still move inside the longitudinal slot. The first screw ensures adequate attachment of the housing 30 to the body 20, while different expansion rates of the housing relative to the body can be compensated for by a movement of the second screw inside the longitudinal slot. Here, the inside the longitudinal slot is in the body 20.

Figure 6:
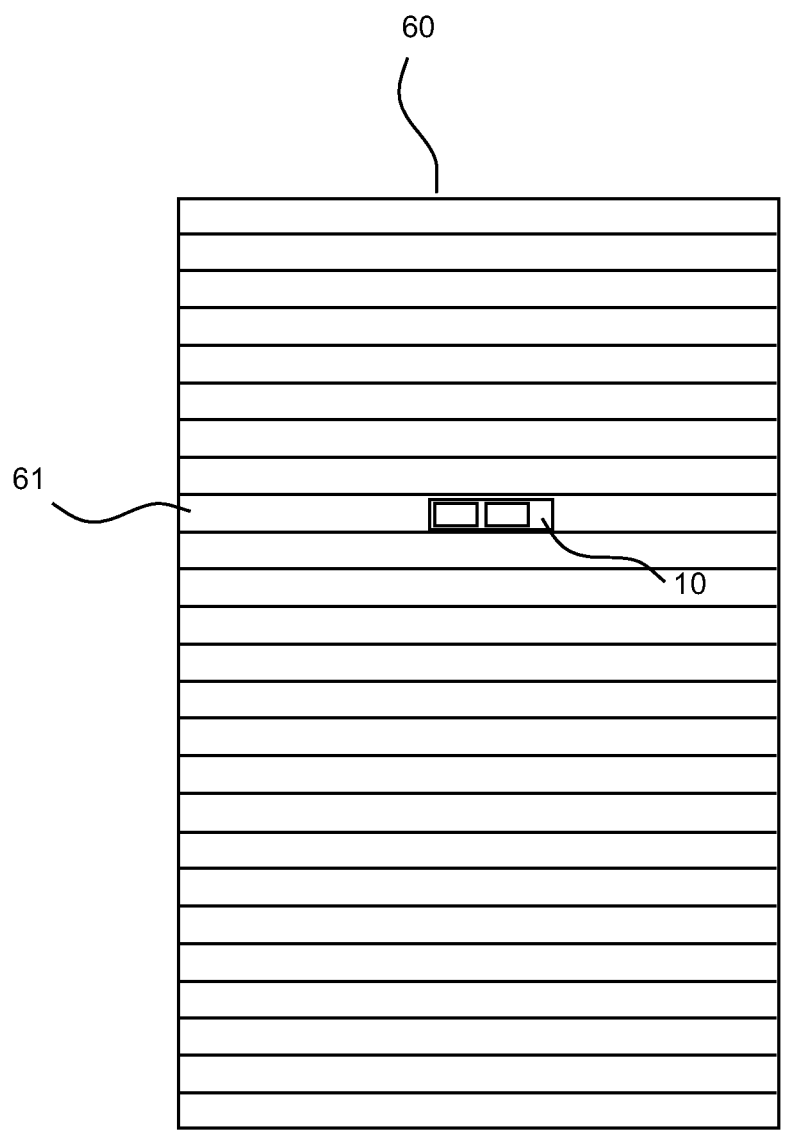
FIG. 6 is a top view of a transportation container, with a receptacle device for a modular telematic unit.

FIG. 6 is a top view of a transportation container, with a receptacle device for a modular telematic unit, which has been installed. In an exemplary embodiment, the transportation container is a freight container or a swap body made of metal, whereby metal plates that have been folded over several times are normally used to reinforce the container body. The folded-over portion in the metal plates forms channel-shaped depressions 61 that normally run crosswise over the side walls and the cover of the transportation container. The receptacle device 10 according to the subject innovation for a modular telematic unit can advantageously be inserted into these channel-shaped depressions 61. In this case, the receptacle device 10 is thus installed crosswise to the transportation or driving direction of the transportation container 60 on the top of the transportation container 60.

Depending on the application purpose, however, the receptacle device according to the subject innovation for a modular telematic unit can also be installed lengthwise to the driving direction and/or onto the side walls of the transportation container.

The receptacle device 10 can be screwed onto the transportation container 60 or else it can have, for example, at least one magnet by which the receptacle device 10 can be attached to the metal cover of the transportation container. This embodiment allows easy installation and removal of the receptacle device according to the subject innovation onto or from a transportation container. In case of screwed connections, the receptacle device 10 can have at least one bore.

Figure 7:
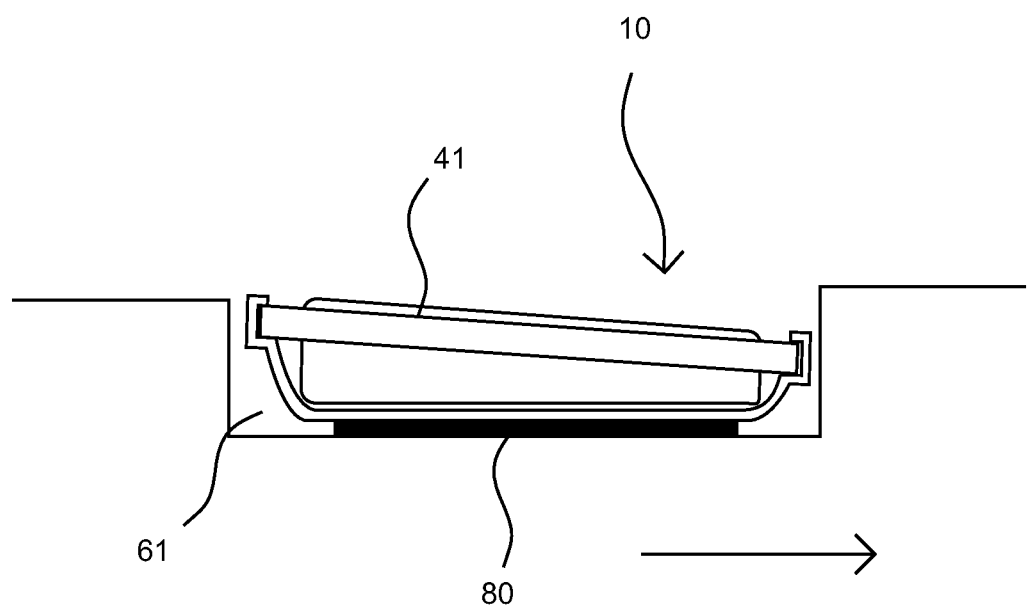
FIG. 7 is a side view of a section of the top of a transportation container, with a receptacle device for a modular telematic unit attached to it.

The installation of a receptacle device on the top of a transportation container is shown once again in a detailed view in FIG. 7. FIG. 7 is a side view of a section of the top of a transportation container, with a receptacle device for a modular telematic unit attached to it. Here, the receptacle device has been inserted into a channel-shaped depression 61 and affixed there with a magnet 80. The height of the receptacle device is selected in such a way that it can be sunk into the channel-shaped depression 61, essentially without protruding from the depression. In particular, several transportation containers can be stacked on top of each other without this causing damage to the attached telematic units. Moreover, the outer surface 41 of the solar panel 40 is slanted relative to the transportation or driving direction of the transportation container, which is indicated in FIG. 7 by an arrow.

In another embodiment of the subject innovation, however, the receptacle device can also be attached to the door of a transportation container. In this case, the receptacle device could be attached vertically to the door and be provided with a switch that is connected to the telematic unit of the receptacle device. The switch is activated by opening or closing the door, so that the telematic unit is activated or deactivated. In this case as well, it is advantageous for the receptacle device to be configured to be flat and, if applicable, for it to be able to be sunk into a channel-shaped depression inside the door.

What is claimed is:

1. A receptacle for a modular telematic unit, comprising:
    a body having at least two rails positioned opposite from each other;
    at least one housing configured to be detachably slid into the rails; and at least one solar panel configured to be detachably slid into the rails, wherein an outer surface of the solar panel, when slid into the rails, is slanted at an angle α relative to at least one outer surface of the body, wherein the outer surface of the body is positioned opposite the solar panel.

2. The receptacle in claim 1, wherein the housing is divided into at least two parts by a flat, lengthwise cut.

3. The receptacle in claim 2, wherein the housing comprises fiberglass-reinforced plastic.

4. The receptacle in claim 3, wherein the housing comprises at least one receptacle into which a component of the modular telematic unit can be inserted, wherein the component comprises at least one of an accumulator, a GPS module, a radio module, a sensor, and a printed circuit board.

5. The receptacle in claim 4, wherein the angle α is between 1 degree and 5 degrees.

6. The receptacle in claim 1, wherein the rails are slanted at the angle α relative to the outer surface of the body.

7. The receptacle in claim 1, wherein the rails are parallel to the outer surface of the body, wherein the solar panel is shaped to be tapered in one direction, resulting in the outer surface of the solar panel being slanted at the angle α relative to the outer surface of the body.

8. The receptacle in claim 1, wherein the rails are parallel to the outer surface of the body, and wherein a distance from the rails to the outer surface of the body differs, resulting in the outer surface of the solar panel being slanted at the angle α relative to the outer surface of the body.

9. The receptacle in claim 1, wherein the body comprises a baseplate onto whose sides the rails are attached, and wherein there is an air space between the baseplate of the body and a baseplate of the housing when the housing is slid into the rails.

10. The receptacle in claim 9, wherein a height, h, of the air space is between 0.5 millimeters (mm) and 8 mm.

11. The receptacle in claim 10, wherein the housing is attached to the body by at least two screwed connections, wherein a first screwed connection is a fixed bearing, and wherein a second screwed connection is a floating bearing with a longitudinal slot.

12. The receptacle in claim 11, wherein the body comprises at least one magnet.

13. A transportation container, comprising a receptacle for a modular telematic unit, the modular telematic unit comprising:
 a body comprising at least two rails situated opposite from each other;
 at least one housing configured to be detachably slid into the rails; and
 at least one solar panel configured to be detachably slid into the rails, wherein an outer surface of the solar panel, when slid into the rails, is slanted at an angle α relative to at least one outer surface of the body, wherein the outer surface is opposite the solar panel.

14. The transportation container in claim 13, wherein the transportation container comprises a freight container or a swap body, wherein the transportation container comprises one or more channel-shaped depressions on an outside of the transportation container, and wherein the receptacle is positioned in one of the channel-shaped depressions.

* * * * *